United States Patent [19]

Heald et al.

[11] 4,173,765

[45] Nov. 6, 1979

[54] V-MOS IMAGING ARRAY

[75] Inventors: David L. Heald, Hermosa Beach, Calif.; Teh-Hsuang Lee, Webster; Rajinder P. Khosla, Rochester, both of N.Y.

[73] Assignee: Eastman Kodak Company, Rochester, N.Y.

[21] Appl. No.: 909,907

[22] Filed: May 26, 1978

[51] Int. Cl.$^2$ .................. H01L 29/78; H01L 27/14
[52] U.S. Cl. ........................................ 357/23; 357/30; 357/24; 357/55; 307/304; 307/311; 357/31
[58] Field of Search ............... 357/30, 24, 23, 55, 357/31; 307/304

[56] References Cited

U.S. PATENT DOCUMENTS

| | | | |
|---|---|---|---|
| 3,911,559 | 10/1975 | Bean | 29/578 |
| 3,924,265 | 12/1975 | Rodgers | 397/23 |
| 3,973,146 | 8/1976 | Arnold | 357/26 |
| 3,975,221 | 8/1976 | Rodgers | 148/191 |
| 4,003,036 | 1/1977 | Jenne | 340/173 R |
| 4,003,126 | 1/1977 | Holmes | 29/571 |
| 4,081,841 | 3/1978 | Ochi | 358/213 |
| 4,084,175 | 4/1978 | Ouyany | 357/55 |
| 4,084,190 | 4/1978 | Stein | 358/213 |
| 4,105,475 | 8/1978 | Jenne | 148/175 |

OTHER PUBLICATIONS

Lee, *Journ. of Appl. Physics*, vol. 40, No. 11, Oct. 1969, pp. 4569 et seq.
Tseng et al., 3rd Int. Conf. on The Technology and Application of Charge Coupled Devices, pp. 75 et seq.

*Primary Examiner*—Martin H. Edlow
*Attorney, Agent, or Firm*—T. H. Close

[57] ABSTRACT

A solid state image sensing device comprises an array of picture sensing elements which are MOS transistors formed on a bulk of semiconductor material. The transistors are of a V-MOS configuration and have respective sources, V-shaped gates, and drains. The source-to-bulk diode of a V-MOS picture sensing element functions as a photodiode and is disposed near the surface of the array to receive a respective portion of imagewise illumination. In a preferred embodiment, the drain of the V-MOS picture sensing element is buried in the bulk directly beneath its respective source. The source, in conjunction with its gate, acts as a multiplex switch for the photodiode.

24 Claims, 18 Drawing Figures

V-MOS IMAGING ARRAY

BACKGROUND OF THE INVENTION

1. Field of the Invention

This invention relates to solid state image sensing arrays and more particularly to such arrays wherein a MOS transistor provides both a photodiode and a multiplex switch for respective picture elements of the array.

2. Description Relative to the Prior Art

The invention as well as the prior art will be described with reference to the accompanying Figures, wherein.

Figure 1:
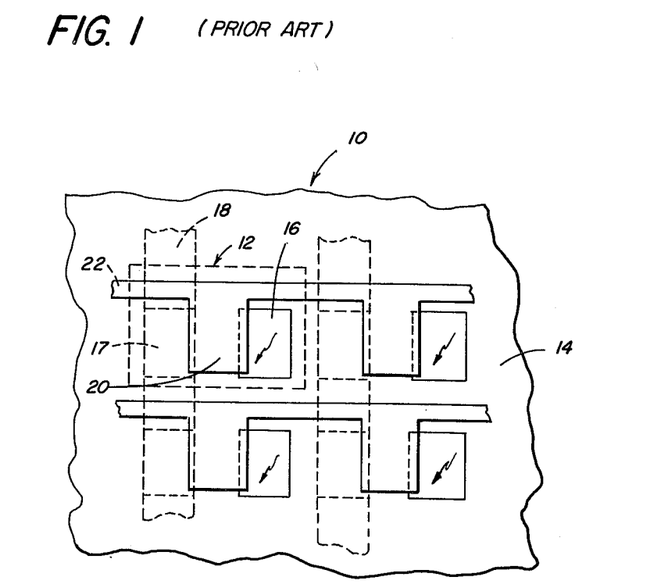
FIG. 1 is a schematic plan view of a portion of a solid state image sensing array of MOS transistors representative of the type known in the prior art.

Solid state image sensing arrays using MOS transistors for sensing individual picture elements are known in the prior art. FIG. 1 schematically depicts the construction of a portion of an image sensing array 10 of the general type known in the prior art. In such an array, respective MOS transistors are used both for sensing a portion of the imagewise illumination to produce an electrical signal having a component representative of the portion of the image sensed, and for providing a multiplex switch associated with the individual sensor to transfer the signal thus generated to an output device. The individual MOS transistors 12 are arranged in rows and columns on a substrate 14 commonly called a chip. The sources 16 of the MOS transistors are disposed to be exposed to light that is imaged on the array. The p-n junctions between the sources and the substrate act as photodiodes. When a photon is absorbed by a diode, an electron-hole pair is generated. The electron and hole are separated and a charge equivalent to one electron is formed on the capacitance of the diode. The charges thus accumulated by the individual diodes, after a sufficient integration time, are transferred to an output device for constructing a signal representative of the image exposed on the array. In the array shown in FIG. 1, the charges accumulated on the picture sensing elements of a given row are transferred in parallel to an output device such as an analog shift register for forming one line of video information. The drains 17 of the MOS transistors in each column are connected by lines 18, and the gate electrodes 20 of the MOS transistors in each row are connected by lines 22. The advantages of an image sensing array of the type discussed above are described in the paper entitled "Optimization of a Solid State Image Sensor" presented by H. F. Tseng and G. P. Weckler at the 3rd International Conference on the Technology and Application of Charge-Coupled Devices, 1976.

As can be seen from FIG. 1, the surface area on the chip that is occupied by the drains of the MOS transistors, the common lines interconnecting the drains in each column, the gate electrodes, and the common lines interconnecting the gate electrodes in each row comprises a substantial portion of the entire surface area of the chip in this prior art device.

In order to increase the efficiency and resolution per unit area of an image sensing array, it is desirable to minimize the size of and spacing between individual picture sensing elements.

SUMMARY OF THE INVENTION

According to the present invention, picture sensing elements of a solid state image sensing array are respectively configured as V-MOS transistors. The term "V-MOS" refers to a metal oxide silicon device formed on the sloped face of a V-shaped depression, as described in U.S. Pat. No. 3,924,265 issued Dec. 2, 1975 to T. J. Rodgers. The source of a V-MOS transistor comprises part of a photodiode which is disposed near the surface of the array. The gate is disposed in a V-shaped depression in the surface of the chip. In the preferred embodiment, the drain of the V-MOS transistor is buried in the bulk and is located directly beneath the source. In a typical array, the drains of the V-MOS elements in a column are connected. The gate electrodes of the V-MOS elements in a row are similarly connected. The gate electrodes may be connected to a line selecting device such as a digital shift register and the drains may be connected to an output device such as an analog shift register. The V-MOS elements in a particular row are addressed simultaneously and read in parallel into the output device. The signals from the individual V-MOS elements comprising the row are then clocked in series out of the output device to provide a standard video signal. When the gate electrode of a V-MOS element is actuated by applying a voltage, the area under the gate forms a conductive channel between the source and the drain of the element. Photocharges generated by the source-to-bulk diode of a V-MOS element is integrated and stored on the capacitance of the source junction. When a voltage is applied to the gate, the accumulated photocharge is transferred to the buried drain line and hence to the output device.

DESCRIPTION OF THE PREFERRED EMBODIMENTS

Figure 2:
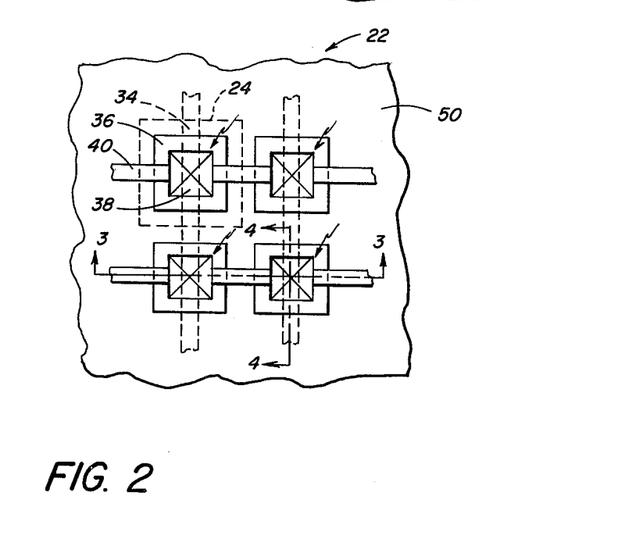
FIG. 2 is a schematic plan view of a portion of an image sensing array of V-MOS picture sensing elements according to the present invention.

FIG. 2 shows a portion of an image sensing array 22 employing V-MOS transistors 24 as individual picture sensing elements according to the present invention. Comparing the size of the prior art MOS picture sensing element 12 in FIG. 1 with the V-MOS element 24 in FIG. 2 (both figures indicating photo-diode areas of comparable size), it can be seen that the V-MOS element of the present invention occupies less area on the surface of the chip. Consequently, more picture sensing elements can be provided in an image sensing array of the same overall size as prior art arrays, thereby improving the resolution of an array of a given size or reducing the size of an array of a given number of elements. The V-MOS picture elements 24, shown in FIG. 2, would be approximately 18 microns square assuming a 5 micron design rule, i.e. that the minimum achievable line width is 5 microns. The greater packing density achieved through the use of the V-MOS configuration by the present invention is possible partly because the gates of the picture sensing elements are disposed on sloping surfaces of V-shaped depressions. More importantly, the drains and their interconnecting lines 34, which were disposed on the surface of the chip in prior art devices, are buried in the substrate and are located directly below their respective sources 36 and their respective gates 38, thereby providing still greater economy of chip surface area.

Figures 3, 4:
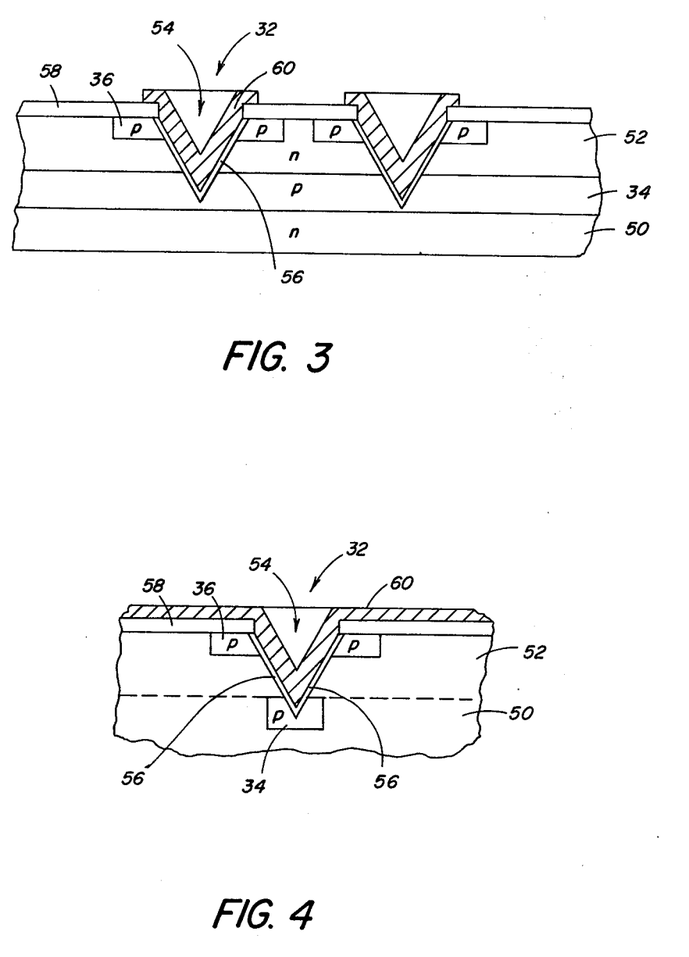
FIG. 3 is a cross-sectional view of the portion of an image sensing array shown in FIG. 2 taken along lines 3—3.
FIG. 4 is a cross-sectional view of the portion of an image sensing array shown in FIG. 2 taken along lines 4—4.

The structure of the V-MOS picture sensing elements comprising the image sensing array according to the invention can be seen in FIG. 3, which shows a cross-section of the array of FIG. 2 taken along lines 3—3. Each V-MOS element 32 is formed on a substrate 50 of crystalline silicon material that may be either p- or n-type material. In all of the following examples, the devices shown are p-channel and the substrate is of n-type material; however, it is to be understood that a p-type substrate with n-channels may be preferable for certain applications. All relative directions are taken with respect to the views appearing in the drawings. As can be seen in FIG. 3, a buried strip of p-type material 34 is spaced above the bottom surface of the n-type substrate 50, a cross-section of the strip 34 being shown in FIG. 4. A layer 52 of n-type material is epitaxially disposed over the buried strip of p-type material and a p-type source area 36 is disposed near the upper surface of the layer 52. A recess 54, having a generally V-shaped cross-section extends from the upper surface of the device like an inverted pyramid, through the source 36 and into the buried strip 34. A relatively thin gate oxide layer 56 is thermally grown on the surface of this recess. Silicon dioxide, in a relatively thicker layer 58, covers the surface of the chip. A layer of conductive material 60 covers the inside surface area of the recess 54 to provide a gate electrode for the V-MOS element. The p-type source area 36 near the top surface of the device and the surrounding n-type material of the bulk form a photodiode. A charge proportional to the integrated quantity of light that falls on the photodiode will be accumulated by the photodiode. The gate 56 and the buried strip 34 comprise a switch that can be closed for transferring the charge accumulated by the photodiode to the buried strip 34.

Figure 5:
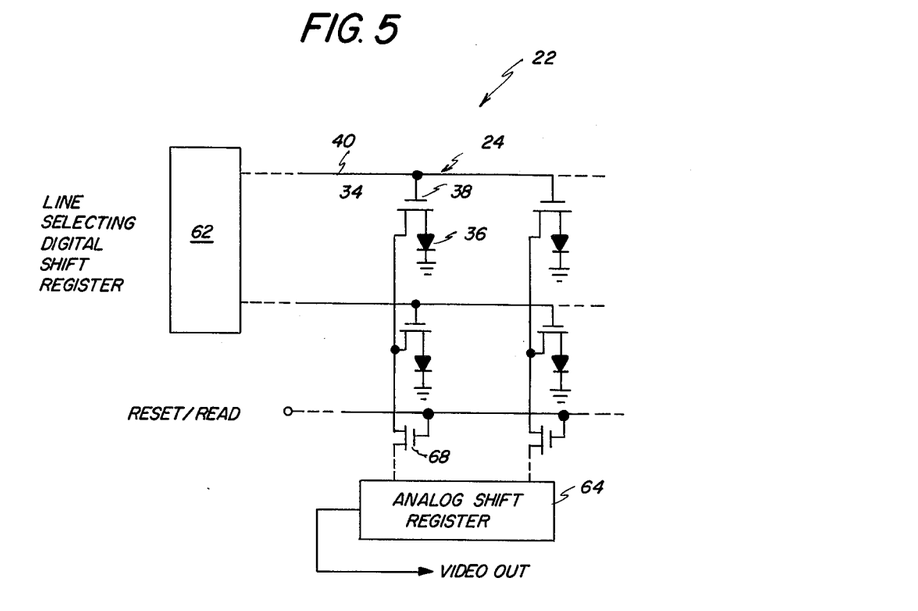
FIG. 5 is a schematic circuit diagram of an image sensing array and its associated addressing scheme.

FIG. 5 shows the basic organization of an image sensing array employing the V-MOS picture sensing elements of the present invention. The light sensitive source-to-bulk diodes of the V-MOS elements are shown as diodes 36. All of the drains 34 of the V-MOS elements in respective columns are connected. All of the gates 38 of the V-MOS elements in respective rows are connected by respective conductors 40. When the gates in a given row are simultaneously pulsed, by a driving shift register 62, the charges accumulated by the photodiodes in that row are transferred in parallel to the drains 34 and thence to an output device 64. The output device could, for example, comprise a three-phase polysilicon overlapping gate structure CCD to achieve maximum compactness on the chip. The driving shift register 62 may use V-MOS transistors to further conserve space on the chip.

The transfer of charge from the individual photodiodes to the buried drains may be enhanced by reverse biasing the buried drains with respect to the sources prior to activating the gates of the V-MOS elements. For this purpose, reset/read switches 68 are momentarily closed before the row gates are pulsed. Then the gates of a given row of picture sensing elements are activated by the driving shift register 62 to transfer photocharges to the buried drains, the reset/read switches 68 are then actuated a second time to allow the charges to move into the output device 64.

The image sensing array 22 operates as follows: The reset/read line is pulsed to close momentarily reset/read switches 68 and thereby bias the buried drains 34. Meanwhile, light falling on the sources 36 causes photocharge to be accumulated on the respective capacitances of the source-to-bulk junctions. When the gates 38 of a given row of picture elements are actuated by the driving shift register 62, the respective accumulated photocharges are transferred to the buried drains 34. The reset/read line is then pulsed a second time to transfer simultaneously the charges held in the buried drains 34 to the output device 64. The output device is next clocked in a known manner to produce a serial train of pulses, representing one line of video information, at its output.

Figure 6:
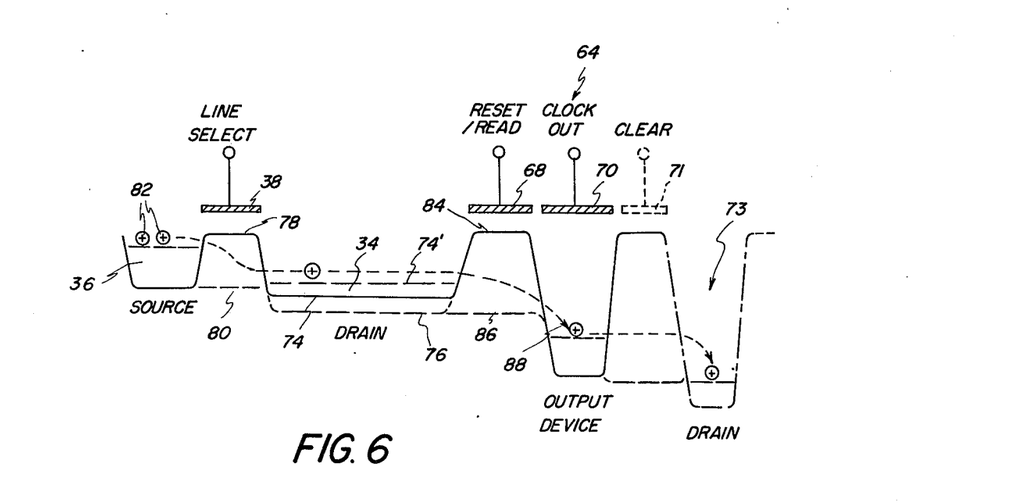
FIG. 6 is a schematic diagram representing a cross-section of a portion of the image sensing array shown in FIG. 5 including a potential diagram showing how a charge accumulated by a photodiode is transferred from the photodiode to the output device.

FIG. 6 schematically shows a cross-section of a portion of one column of the imaging array including a source 36, a gate 38, a drain 34, a reset/read gate 68, and a cross-section of output device 64, including a cross-section of one of the output device's gating electrodes 70. In operation, a pulse is applied to the reset/read gate 68 to connect thereby the drain 34 to the potential well of the output device 64. This lowers the potential of the buried drain to improve the charge transfer from source 36 to the drain 34. Any charge thus transferred to the output device 64 may be removed by simultaneously pulsing all of the gating electrodes 70 of the output device to thereby evenly distribute the charge throughout the output device, or by pulsing a gate 71 to thereby transfer the unwanted charge to a drain 73. The potential of the drain 34 prior to the reset pulse is shown by the solid line 74 and after the reset pulse by the dotted line 76. By thus "resetting" before "reading", unwanted changes that may be in the drain lines are removed. Next, a drive pulse is applied to the gate electrode 38 to lower the potential, represented by the solid line 78, under the gate to that indicated by the dotted line 80, thereby allowing the accumulated photocharge, shown schematically as holes 82, at the source 36 to flow into the drain 34 which causes the drain potential to change toward 74'. A second pulse is then applied to the reset/read gate 68, to lower the potential barrier under the reset/read gate from the level represented by solid line 84 to the level represented by dotted line 86 to allow the photocharge 82 in drain 34 to be transferred to the potential well 88 of output device 64. The photocharge is then moved in the output device in a direction perpendicular to the plane of the drawing by clocking the gates 70 of the output device in a known manner.

Figure 7:
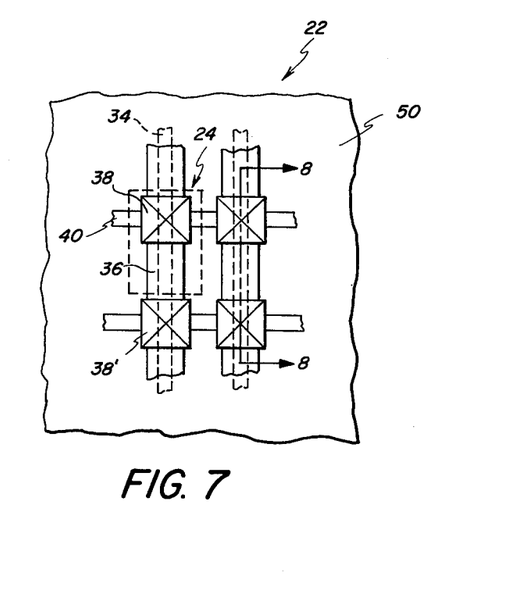
FIG. 7 is a schematic plan view of a portion of an image sensing array according to an alternative embodiment of the present invention.

A further reduction in the size of a picture sensing element, while retaining approximately the same photodiode area, has been achieved according to the present invention by recognizing that a source may be common to two adjacent V-MOS picture sensing elements. An example of this further reduction in size is shown in FIG. 7. The parts of the individual picture sensing element that correspond to the parts of the picture sensing element shown in FIG. 2 are similarly numbered. In the image sensing array 22, shown in FIG. 7, the source 36 of a V-MOS picture sensing element is immediately adjacent the gate 38' of the neighboring V-MOS element in its respective column. The V-MOS elements 24 in the array 22 are disposed in rows and columns upon a substrate 50. An element includes a source 36, a buried drain 34 that is extended to interconnect the elements in a column thereof, and a V-shaped gate area covered by a gate electrode 38, the rows of gates being connected by respective lines 40. The fact that a source 36 is adjacent to the gate 38' of the neighboring V-MOS element would at first appear to present a problem since the photocharge at the source 36 will be transferred to the drain 34 when either gate 38 or gate 38' is actuated. Likewise, when a given gate in a column is pulsed to transfer the photocharge to the underlying drain, any accumulated photocharge at either source adjacent the gate will be transferred. This is not a serious problem, however, since when the gate in the next row is actuated, the photocharge at the source of the V-MOS element in the previous row will have been previously discharged. The relatively short time elapsed since such prior discharge will allow relatively little additional charge to accumulate. Hence, most of the photocharge from a source will be that accumulated for a full integration time. For example, if the gating pulses propagate from the row of picture elements shown nearest the top of the drawing in FIG. 7 to the row nearest the bottom, the source immediately below each gate will contribute most of the charge read out. To normalize the output from the top row, no source would be provided immediately above the gates in the top row.

Figure 8:
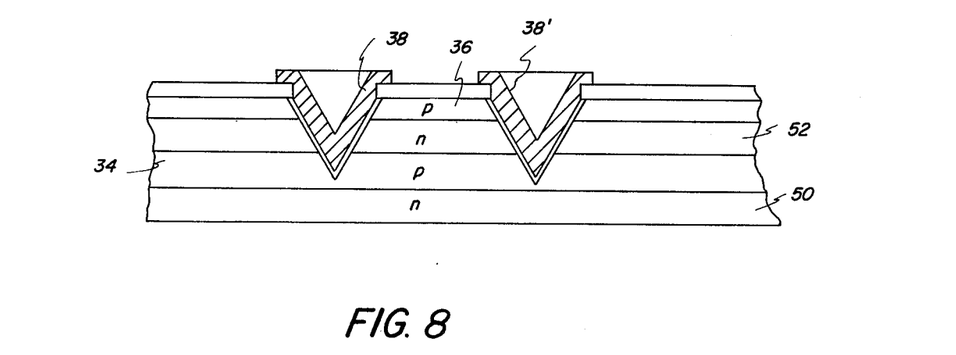
FIG. 8 is a cross-section of the portion of the image sensing array shown in FIG. 7 taken along line 8—8.

A cross-section of the portion of the image sensing array 22 shown in FIG. 7 taken along lines 8—8 is shown in FIG. 8 to demonstrate how the buried drain lines 34 and the sources 36 are produced in continuous strips. The continuity of the respective strips of sources 36 is broken by the V-shaped etchings to provide discrete photodiode regions. Since the sources 36 and the drains 34 are created in continuous strips and then the sources broken up into discrete regions by the V-shaped etchings, mask tolerances can be less critical than for conventional MOS picture sensing elements.

Construction of an image sensing array consisting of individual V-MOS picture sensing elements, as shown in FIG. 2, can be accomplished by following the conventional semiconductor processing steps outlined below. Obvious variations to the known methods of manufacture can be used to produce an array of V-MOS elements of the type shown in FIG. 7. The steps will be described with reference to FIGS. 9a-h.

Figure 9A:
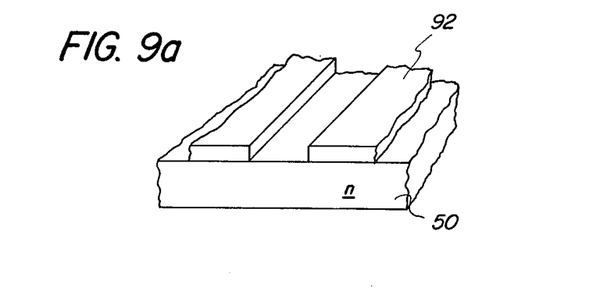
FIGS. 9a–9h are cross-sectional views illustrating the steps for making a V-MOS picture sensing element of the type shown in FIG. 2.

As shown in FIG. 9a, a substrate of semi-conductor material 50 is chosen having the proper thickness (approximately 250 microns) and type (n-type assuming that a p-channel device is being manufactured). The crystal orientation of the substrate is chosen so that the V-shaped depressions can be formed in the substrate by treating it with an anisotropic etchant. See D. B. Lee *Anisotropic Etching of Silicon,* Jornal of Applied Physics, Vol. 40, No. 11, pages 4569-74, October, 1969.

Figure 9B:
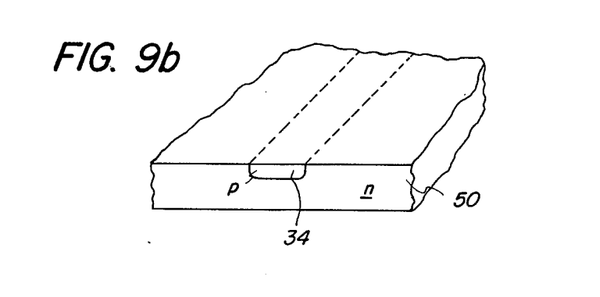

A first mask is formed in a known manner on the substrate 50 by providing a layer 92 of silicon dioxide. The oxide layer is then treated with a suitable etchant such as buffered hydrochloric acid to remove the oxide from the areas on the surface where a buried drain 34 is to be formed. As seen in FIG. 9b, a line 34 of p-type dopant, for example Boron or another suitable trivalent element, is diffused into the surface of the substrate 50 to a depth of about one micron. The remainder of the oxide layer 92 is then removed.

Figure 9C:
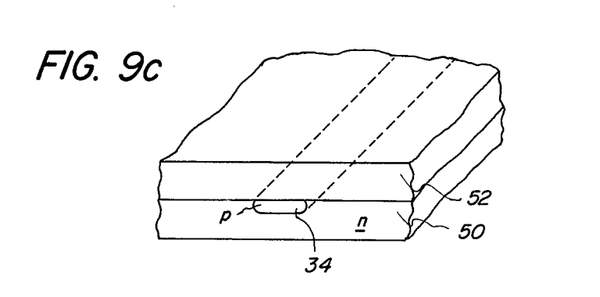
Figure 9D:
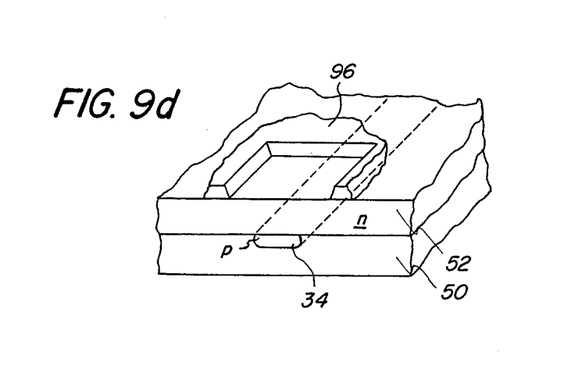
Figure 9E:
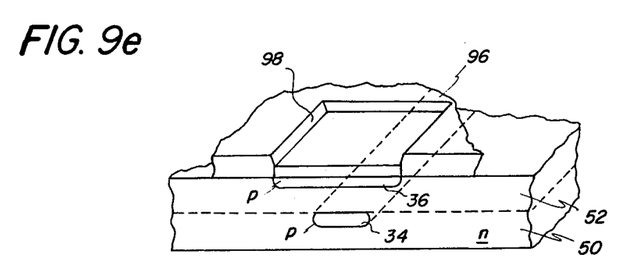

The next step, as shown in FIG. 9c, comprises the growth of an epitaxial layer 52 of silicon doped with n-type material, such as Phosphorous or another suitable pentavalent element, in a known manner, over the surface of the substrate, burying the p-type diffusion 34 to a depth of 5-10 microns. The chip is again provided with an oxide layer 96, as shown in FIG. 9d, to a depth of about one-half micron. This oxide layer 96 is then etched to form a mask 98 for the rectangular source area of a V-MOS element. A diffusion of p-type dopant is then made through this mask to form a p-type source 36 that is spaced above the buried drain 34 as shown in FIG. 9e.

Figure 9F:
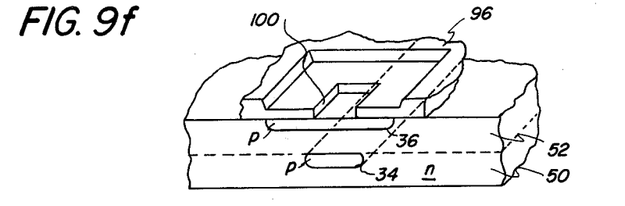
Figure 9G:
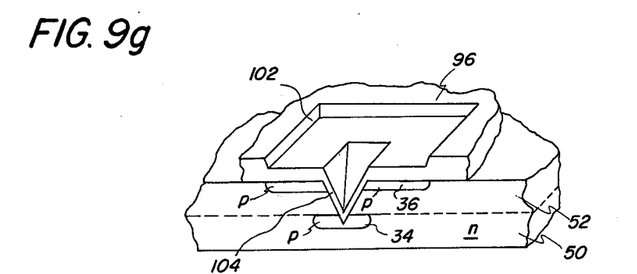

Another oxide layer is grown over the surface of the chip to a thickness of a few tenths of a micron and, as shown in FIG. 9f, this layer is etched to form a smaller rectangular area 100 centered over the source diffusion 36. As shown in FIG. 9g, an anisotropic etchant such as hydrazine and water is used in a known manner to produce a V-shaped recess 102 that is shaped like an inverted pyramid having a base represented by the rectangular area 100 that was formed in the oxide layer 96. The tip of the pyramid 102 penetrates the buried drain line 34.

Figure 9H:
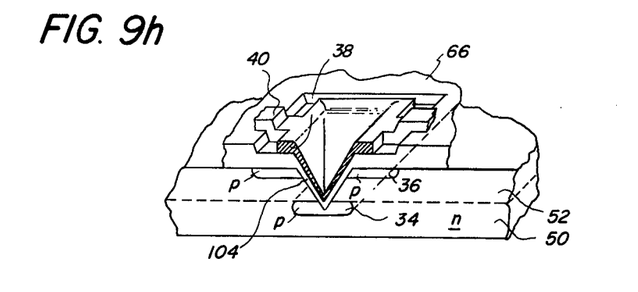

A gate oxide layer 104 is now grown on the inside surface of recess 102 to a thickness of approximately 800A to 1500A using a known oxidation procedure. Finally, as shown in FIG. 9h, a metal deposition is made over the gate oxide layer to provide a gate electrode 38. As was pointed out above, the gate electrodes of the V-MOS elements in a row are connected by lines 40.

Figure 9I:
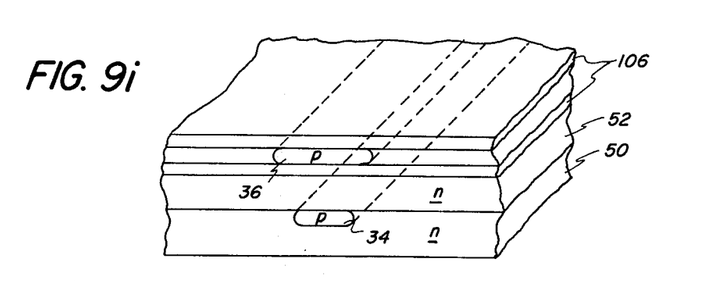
FIGS. 9i and 9j are cross-sectional views illustrating improvements to the V-MOS picture sensing element shown in FIGS. 9a–9h.

Since the amount of photocharge than can be effectively accumulated by the photodiode is limited by the capacitance of the diode, it may be desirable to increase this capacitance. The capacitance of the photodiodes may be significantly increased by providing n+-type layers directly above and below the p-type sources over the entire surface of the chip. This step is shown in FIG. 9'i. The n+-type layers 106 increase the effective capacitance of each photodiode and may be tailored to control the switching threshold of the V-MOS transistor.

This modification also has the benefit of increasing the blue sensitivity of the element by creating a barrier to surface recombination of photocharges generated near the surface of the element.

Figure 9J:
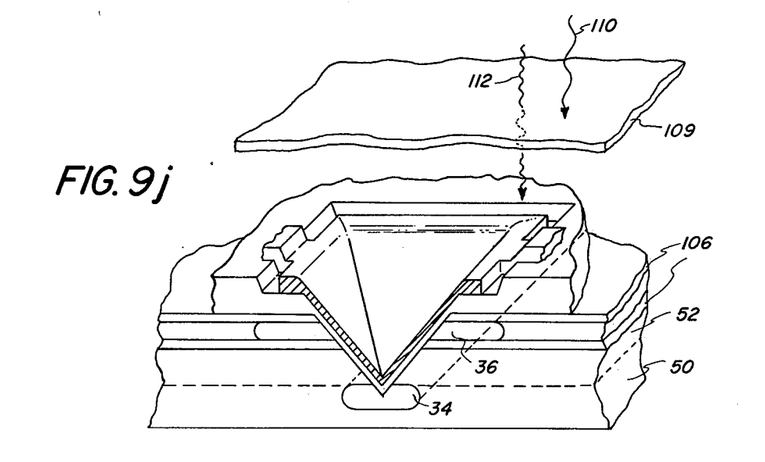

In the devices disclosed in FIGS. 2 and 7, there may occur an undesired direct generation of photocurrent by the buried drain lines. Since light of longer wavelengths is able to penetrate to greater depths into the substrate 50, this phenomenon may be significantly lessened by providing a filter layer 108 as shown in FIG. 9j over the entire device. The filter blocks transmission of the longer wavelengths 110 of light while allowing the shorter wavelengths 112 to pass. Furthermore, by resetting before reading as previously described, unwanted photocharges that may have accumulated in the drain lines are removed immediately before each read cycle.

One method for making an image sensing array according to the present invention has been described; however, other methods could be used. For example, the buried drains may be achieved by the known technique of ion-implantation rather than diffusion and subsequent epitaxial growth. The invention has been described in detail with respect to implementations thereof. It will be appreciated, however, that to those skilled in the art, many different construction techniques will suggest themselves without departing from the spirit and scope of the invention.

What is claimed is:

1. An improved solid state image sensing element formed as an MOS transistor on a bulk of semiconductor material, wherein the improvement comprises:
   said bulk having a surface with a depression therein, said depression having a generally sloping side; and
   said MOS transistor being formed on the sloping side of said depression,
thereby to provide an image sensing element of a size that is economical of space on the bulk surface.

2. The image sensing element claimed in claim 1, wherein said MOS transistor includes a source, a drain, and a gate, said source being disposed near said surface adjacent said depression and being adapted to be exposed to light, said drain being disposed adjacent said depression, spaced from said source and buried in said bulk, and said gate being disposed on said sloping side of said depression and extending between said source and said drain.

3. In combination with the image sensing element claimed in claim 1, a second image sensing element, the source of the first image sensing element being adjacent the gate of said second image sensing element.

4. A solid state image sensing element, comprising:
   a bulk of semiconductor material of a first dopant type, said bulk having a surface with a depression formed therein, said depression having a generally sloping side;
   a first region of a second dopant type disposed within said bulk adjacent said depression, said first region being adapted to be exposed to light, the junction between said first region and said bulk forming a photodiode, whereby when said first region is exposed to light, a charge proportional to the quantity of light may be generated and stored on the junction capacitance of said photodiode;
   a second region of said second dopant type disposed within said bulk adjacent said depression and spaced from said first region; and
   a gate, including a gate electrode, disposed on said generally sloping side of said depression, said gate extending between said first and second regions,
whereby, when said gate electrode is electrically activated, said charge is transferred from said photodiode to said second region.

5. The invention claimed in claim 4, wherein said first and second regions and said gate comprise a V-MOS transistor.

6. The invention claimed in claim 4, wherein said depression has a generally V-shaped cross-section.

7. The invention claimed in claim 4, wherein said second region is buried in said bulk.

8. In an improved solid state image sensor of the type comprised of a two dimensional array of individual picture sensing elements formed respectively as individual MOS transistors on a bulk of semiconductor material, the improvement wherein:
   said bulk has a surface formed with depressions therein, said depressions having generally sloping sides; and
   said MOS transistors are formed on the sloping sides of said depressions,
whereby an economy of bulk surface area is achieved thereby increasing the number of individual picture sensing elements that may be formed in an array of a given physical size thereby to increase the resolution of the array.

9. The image sensing array claimed in claim 8 wherein said transistors include, respectively, a source, a drain, and a gate having a gate electrode, the sources of said transistors being disposed to receive light, and wherein said array further comprises means for electrically interconnecting the drains of some transistors aligned in a first dimension and means for electrically interconnecting the gate electrodes of some transistors aligned in a second dimension.

10. The image sensing array claimed in claim 9 wherein said drains and said means for electrically interconnecting said drains are buried in said bulk.

11. The image sensing array claimed in claim 9 wherein said transistors include, respectively, a source, a drain, and a gate having a gate electrode, the source of one transistor being adjacent the gate of another transistor aligned in the first dimension.

12. In a solid state image sensing array, a picture sensing element comprising:
   a substrate of semiconductor material which is largely of a preselected first impurity type, said substrate having an upper surface with a recess therein;
   a first region of semiconductor material adjacent said recess within said substrate and being of an impurity type opposite to that of said first impurity type;
   a second region of semiconductor material adjacent said recess within said substrate and being of the same impurity type as and spaced from said first region, said second region being arranged to be exposed to a portion of an image to be sensed; and
   a gate, including a conductive gate electrode, located within the recess in said substrate, said gate electrode extending between said first and second regions.

13. The invention as claimed in claim 12, wherein said first and second regions and said gate comprise a V-MOS transistor.

14. The invention as claimed in claim 12, wherein said recess is shaped like an inverted pyramid.

15. The invention as claimed in claim 12, further comprising a first layer of semiconductor material disposed over said second region and a second layer of semiconductor material disposed beneath said second region, said layers being of the same impurity type as said substrate and being more heavily doped.

16. The invention as claimed in claim 12, further comprising an infra-red filter over said substrate and said second region.

17. The invention as claimed in claim 12, wherein said first region is extended to form a conductive path adapted to be connected to an output means.

18. The invention as claimed in claim 12, wherein said gate electrode is extended to form a path adapted to be connected to a gating signal means.

19. A picture sensing element for a solid state image sensing device, comprising:
   a substrate of n-type semiconductor material, said substrate having an upper surface with a depression therein;

a first region of p-type semiconductor material buried within said substrate adjacent said depression;

a second region of p-type semiconductor material within said substrate adjacent said depression and spaced from said first region, said second region being disposed to be exposed to light;

a gate, including a conductive gate electrode, located within the depression in said surface, said gate extending between said first and second regions;

a nonconductive layer covering said substrate and said second region and surrounding said depression.

20. The picture sensing element according to claim 19, including a layer of $n^+$-type semiconductor material between said substrate and said nonconductive layer.

21. The picture sensing element according to claim 19, wherein said depression has an inverted pyramidal configuration, said first region forming a buried drain and said second region forming a source of a V-MOS transistor.

22. A picture sensing element for a solid state image sensing device, comprising:

a substrate of p-type semiconductor material, said substrate having an upper surface with a depression therein;

a first region of n-type semiconductor material buried within said substrate adjacent said depression;

a second region of n-type semiconductor material within said substrate adjacent said depression and spaced from said first region, said second region being disposed to be exposed to light;

a gate, including a conductive gate electrode, located within the depression in said surface, said gate extending between said first and second regions;

a nonconductive layer covering said substrate and said second region and surrounding said depression.

23. The picture sensing element according to claim 22, including a layer of $p^+$-type semiconductor material between said substrate and said nonconductive layer.

24. The picture sensing element according to claim 22, wherein said depression has an inverted pyramidal configuration, said first region forming a buried drain and said second region forming a source of a V-MOS transistor.

* * * * *